(12) United States Patent
Lee

(10) Patent No.: US 10,381,414 B2
(45) Date of Patent: Aug. 13, 2019

(54) ORGANIC LIGHT EMITTING DISPLAY DEVICE

(71) Applicant: LG Display Co., Ltd., Seoul (KR)

(72) Inventor: ARyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 15/654,486

(22) Filed: Jul. 19, 2017

(65) Prior Publication Data

US 2018/0166510 A1    Jun. 14, 2018

(30) Foreign Application Priority Data

Dec. 14, 2016 (KR) .......................... 10-2016-0170365

(51) Int. Cl.
*G09G 3/30* (2006.01)
*H01L 27/32* (2006.01)

(52) U.S. Cl.
CPC ...... *H01L 27/3211* (2013.01); *H01L 27/3218* (2013.01); *H01L 27/3246* (2013.01); *H01L 27/3248* (2013.01); *H01L 27/3206* (2013.01); *H01L 27/3241* (2013.01)

(58) Field of Classification Search
CPC ............ H01L 27/3206; H01L 27/3221; G09G 3/3208
See application file for complete search history.

(56) References Cited

U.S. PATENT DOCUMENTS

| | | | |
|---|---|---|---|
| 2013/0140535 A1* | 6/2013 | Chu | ............... H01L 51/5203 257/40 |
| 2014/0197385 A1 | 7/2014 | Madigan | |
| 2016/0013251 A1 | 1/2016 | Yoshida et al. | |

* cited by examiner

*Primary Examiner* — Roy P Rabindranath
(74) *Attorney, Agent, or Firm* — Fenwick & West LLP

(57) ABSTRACT

Disclosed is an organic light emitting display device comprising a plurality of pixels arranged in a first direction and a second direction, the plurality of pixels including a first pixel, a second pixel adjacent to the first pixel in the second direction, and a third pixel adjacent to the second pixel in the second direction, wherein each of the first pixel, second pixel and third pixel includes a first sub pixel, a second sub pixel, and a third sub pixel, the first sub pixel includes a first emission layer, the second sub pixel includes a second emission layer, and the third sub pixel includes a third emission layer, wherein the third sub pixel that is included in the first pixel is adjacent to the third sub pixel that is included in the second pixel in the second direction.

21 Claims, 5 Drawing Sheets

ORGANIC LIGHT EMITTING DISPLAY DEVICE

CROSS REFERENCE TO RELATED APPLICATIONS

This application claims the benefit of Korean Patent Application No. 10-2016-0170365 filed on Dec. 14, 2016, which is hereby incorporated by reference in its entirety.

BACKGROUND

Field of the Disclosure

Embodiments of the present disclosure relate to an organic light emitting display device, and more particularly, to an organic light emitting display device manufactured by a solution process.

Discussion of the Related Art

An organic light emitting display device is provided in such way that an emission layer is formed between a cathode for injecting an electron and an anode for injecting a hole. When the electron generated in the cathode and the hole generated in the anode are injected into the emission layer, an exciton is produced by a bond of the electron and hole. Then, when the exciton falls to a ground state from an excited state, the organic light emitting device emits light.

Hereinafter, a related art organic light emitting display device will be described with reference to the accompanying drawings.

FIG. 1A is a cross sectional view illustrating the related art organic light emitting display device, and FIG. 1B is a plane view illustrating the related art organic light emitting display device.

As shown in FIG. 1A, the related art organic light emitting display device may include a substrate 10, a first electrode 20, a bank layer 30, emission layers 41, 42 and 43, and a second electrode 50.

The first electrode 20 is provided on the substrate 10. The first electrode 20 is patterned by each sub pixel (sP1, sP2, sP3).

The bank layer 30, which covers an end of the first electrode 20, is provided on the substrate 10. The bank layer 30 defines an area of the sub pixel (sP1, sP2, sP3).

The emission layers 41, 42 and 43 are provided on the first electrode 20. The emission layer 41, 42 and 43 are individually provided in the sub pixels (sP1, sP2, sP3). That is, the first emission layer 41 is provided in the first sub pixel (sP1), the second emission layer 42 is provided in the second sub pixel (sP2), and the third emission layer 43 is provided in the third sub pixel (sP3). Accordingly, one pixel is defined by a combination of the first sub pixel (sP1), the second sub pixel (sP2), and the third sub pixel (sP3).

The emission layers 41, 42 and 43 may be individually patterned for each sub pixel (sP1, sP2, sP3) by a vacuum deposition process using a predetermined mask. However, if the emission layers 41, 42 and 43 are patterned by the vacuum deposition process, it is necessary to use a high-priced vacuum deposition apparatus, thereby causing the increase of manufacturing cost. Especially, if manufacturing a large-sized organic light emitting display device, it inevitably causes the increase of manufacturing cost due to the increased size of mask and vacuum deposition apparatus, thereby lowering productivity for mass production. Accordingly, in order to reduce the manufacturing cost, a solution process using an inkjet apparatus has been proposed so as to form the emission layers 41, 42 and 43.

As shown in FIG. 1B, the first emission layer 41, the second emission layer 42, and the third emission layer 43 are patterned, and the bank layer 30 is provided between the adjoining emission layers 41, 42 and 43. In this case, the first emission layer 41, the second emission layer 42, and the third emission layer 43 are aligned at fixed intervals.

However, in case of the related art organic light emitting display device, it has limitations on resolution.

In order to realize high resolution in the organic light emitting display device, it is necessary to decrease a size of the pixel. As shown in FIG. 1B, when the plurality of sub pixels (sP1, sP2, sP3) are aligned, a size of each sub pixel (sP1, sP2, sP3) has to be decreased so as to realize the high-resolution organic light emitting display device.

However, if the sub pixel (sP1, sP2, sP3) is decreased in size, an area of the emission layer 41, 42 and 43 in each of the sub pixels (sP1, sP2, sP3) is also decreased in size.

In order to realize high resolution in the related art organic light emitting display device, it is necessary to decrease a size of each area in the emission layers 41, 42 and 43. To do this, it is necessary to reduce a size of a nozzle in the inkjet apparatus.

However, there is a limitation of how much the nozzle of the inkjet apparatus can be reduced in size. If forming the small-sized area for each emission layer 41, 42 and 43 by the use of inkjet apparatus, the emission layers 41, 42 and 43 may be mixed together without being divided.

Accordingly, it is difficult to make the size of the area in each emission layer 41, 42 and 43 be less than a predetermined value, whereby it is also difficult to realize the high-resolution organic light emitting display device.

SUMMARY

Accordingly, embodiments of the present invention are directed to an organic light emitting display device that substantially obviates one or more problems due to limitations and disadvantages of the related art.

An aspect of embodiments of the present invention is directed to provide an organic light emitting display device capable of realizing high resolution, and preventing emission layers to be separated from each other from being mixed together for a solution process.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device comprising: a plurality of pixels arranged in a first direction and a second direction that intersects the first direction, the plurality of pixels including a first pixel, a second pixel adjacent to the first pixel in the second direction, and a third pixel adjacent to second pixel in the second direction, wherein each of the first pixel, second pixel, and third pixel includes a first sub pixel, a second sub pixel that is adjacent to the first sub pixel in the first direction, and a third sub pixel that is adjacent to the first subpixel and the second sub-pixel in the second direction, the first sub pixel in each of the plurality of pixels including a first emission layer, the second sub pixel in each of the plurality of pixels including a second emission layer, and the third sub pixel in each of the plurality of pixels including a third emission layer, and wherein the third sub pixel of the third color that is included in the first pixel is adjacent to the third sub pixel of the third color that is included in the second pixel in the second direction.

In another aspect of an embodiment of the present invention, there is provided an organic light emitting display device comprising: a first pixel; a second pixel adjacent to the first pixel in a first direction; a third pixel adjacent to the first pixel in a second direction that intersects the first direction; each of the first pixel, the second pixel, and the third pixel comprising a first sub pixel, a second sub pixel, and a third sub pixel; a first emission layer included in the first sub pixel; a second emission layer included in the second sub pixel; and a third emission layer included in the third sub pixel, wherein the first emission layer, the second emission layer, and the third emission layer provided in the first pixel, the second pixel, and the third pixel are separated from each other, and wherein the third emission layer included in the third sub pixel of the first pixel and the third emission layer included in the third sub-pixel of the third pixel is a common third emission layer that extends from the first pixel to the third pixel.

In another aspect of an embodiment of the present invention, there is provided an organic light emitting display device comprising: a first pixel group including a plurality of pixels arranged in a first direction; and a second pixel group adjacent to the first pixel group, the second pixel group including a plurality of pixels arranged in the first direction, wherein an arrangement of sub pixels within the plurality of pixels included in the first pixel group and an arrangement of sub pixels within the plurality of pixels included in the second pixel group is symmetrical across a boundary between the first pixel group and the second pixel group that extends along the first direction.

In another aspect of an embodiment of the present invention, there is provided an organic light emitting display device comprising: a plurality of pixels arranged in a first direction and a second direction that intersects the first direction, the plurality of pixels including a first pixel and a second pixel adjacent to the first pixel in the second direction; wherein the first pixel includes a first plurality of sub pixels, and wherein the second pixel includes a second plurality of sub pixels, wherein only a single sub pixel of the first plurality of sub pixels in the first pixel is adjacent to a single sub pixel of the second plurality of pixels in the second pixel in the second direction, and wherein the single sub pixel in the first pixel is of a same color as the single sub pixel in the second pixel.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION

Figure 1A:
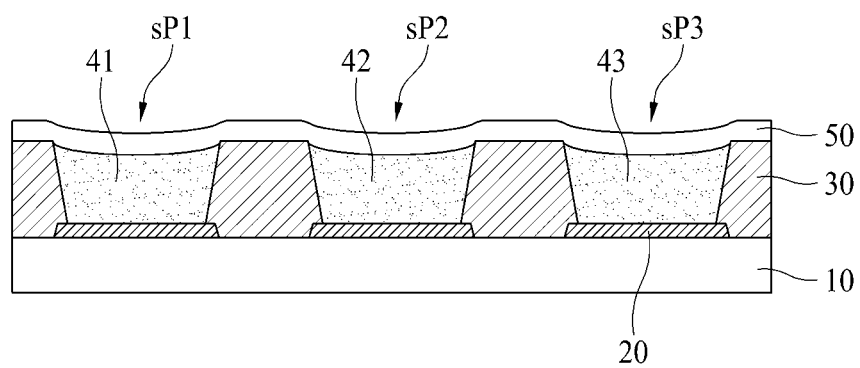
FIG. 1A is a cross sectional view illustrating a related art organic light emitting display device.
Figure 1B:
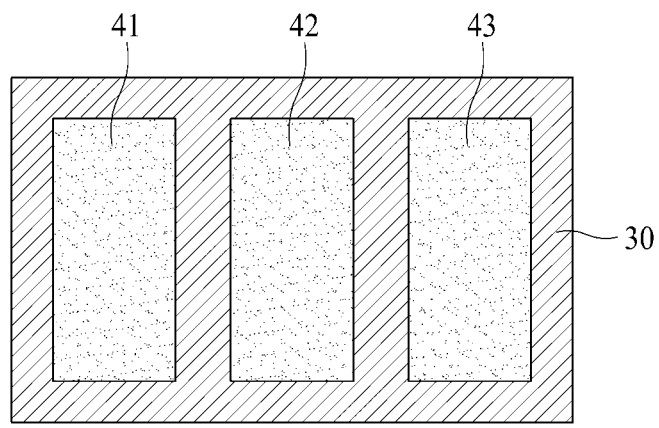
FIG. 1B is a plane view illustrating the related art organic light emitting display device.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only ~' is used. The terms of a singular form may include plural forms unless referred to the contrary.

In construing an element, the element is construed as including an error region although there is no explicit description.

In describing a position relationship, for example, when the positional order is described as 'on ~', 'above ~', 'below ~', and 'next ~', a case which is not contact may be included unless 'just' or 'direct' is used.

In describing a time relationship, for example, when the temporal order is described as 'after ~', 'subsequent ~', 'next ~', and 'before ~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to the embodiment of the present invention will be described with reference to the accompanying drawings.

Figure 2:
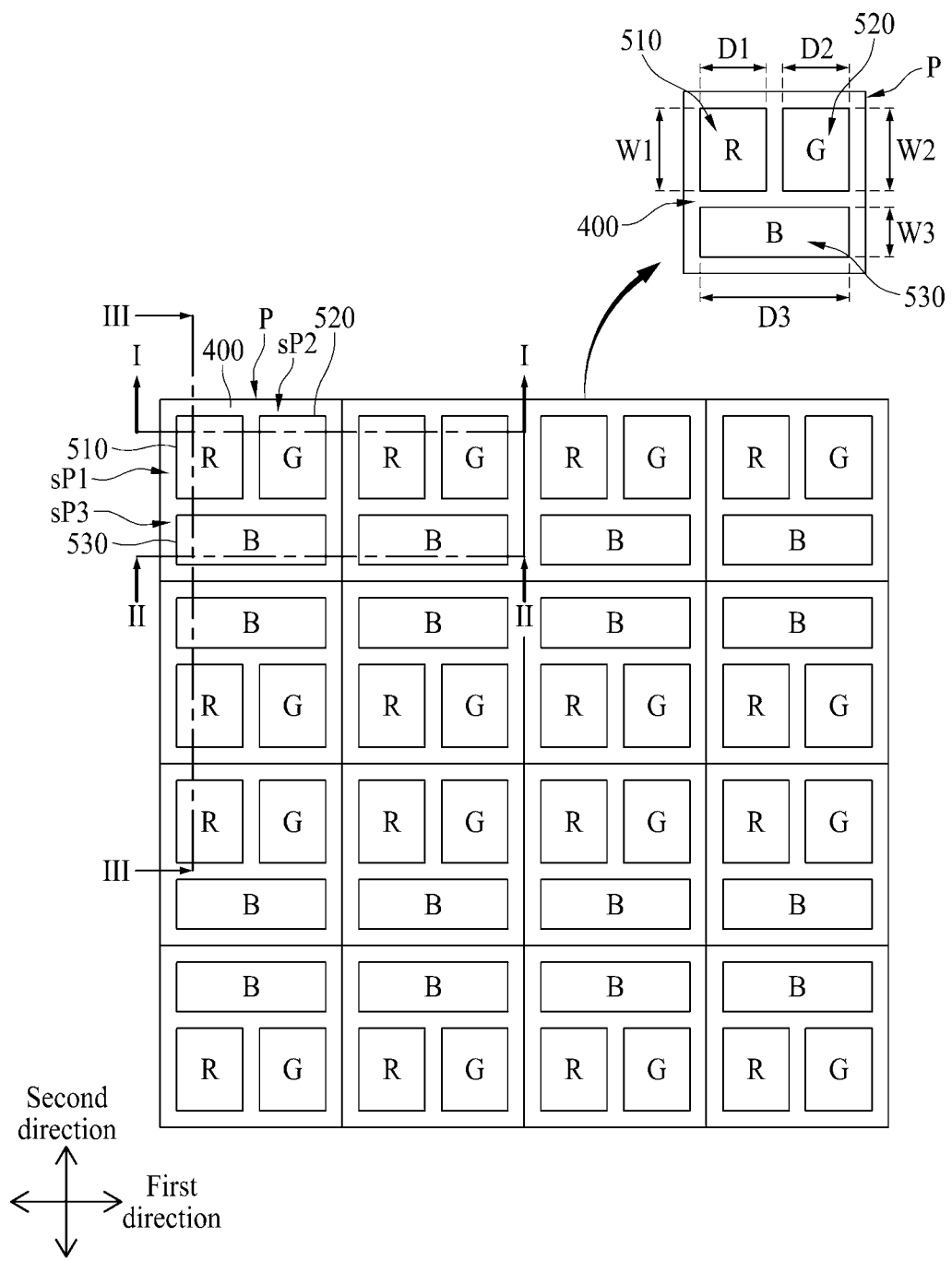
FIG. 2 is a plane view illustrating an organic light emitting display device according to one embodiment of the present disclosure.

FIG. 2 is a plane view illustrating an organic light emitting display device according to one embodiment of the present disclosure.

As shown in FIG. 2, the organic light emitting display device according to one embodiment of the present disclosure may include a plurality of pixels (P) arranged in a first direction (e.g., horizontal) and a second direction (e.g., vertical) which intersects with (e.g., is perpendicular to) the first direction, the plurality of pixels (P) including a first pixel, a second pixel adjoining the first pixel in the second direction, and a third pixel adjoining the second pixel in the second direction.

Each of the first pixel, second pixel and third pixel may include a first sub pixel (sP1), a second sub pixel (sP2), and a third sub pixel (sP3). In the drawings, the first sub pixel (sP1) is the sub pixel emitting red light (R), the second sub pixel (sP2) is the sub pixel emitting green light (G), and the third sub pixel (sP3) is the sub pixel emitting blue light (B), but not limited to these structures. The third sub pixel (sP3) of the first pixel is opposite to the third sub pixel (sP3) of the second pixel in the second direction. That is, the third sub pixel (sP3) of the first pixel is adjacent to the third sub pixel (sP3) of the second pixel.

A first emission layer 510 is provided in the first sub pixel (sP1), a second emission layer 520 is provided in the second sub pixel (sP2), and a third emission layer 530 is provided in the third sub pixel (sP3).

Although not shown in detail, the first sub pixel (sP1) includes a circuit element for making the first emission layer 510 emit light, the second sub pixel (sP2) includes a circuit element for making the second emission layer 520 emit light, and the third sub pixel (sP3) includes a circuit element for making the third emission layer 530 emit light.

In this case, the circuit element may be disposed below each emission layer 510, 520 and 530, or may be disposed below the bank layer 400 provided between the adjoining emission layer among the emission layers 510, 520 and 530. For example, in case that the organic light emitting display device according to the present disclosure is a top emission type, even though the circuit element is disposed below each emission layer 510, 520 and 530, the light emission is not influenced by the circuit element, whereby the circuit element may be disposed below each emission layer 510, 520 and 530. However, in case that the organic light emitting display device according to the present disclosure is a bottom emission type, if the circuit element is disposed below each emission layer 510, 520 and 530, the light emission is influenced by the circuit element, whereby the circuit element may be disposed below the bank layer 400.

The bank layer 400 is provided between each of the first emission layer 510, the second emission layer 520, and the third emission layer 530, to thereby define an emission area for each of the first sub pixel (sP1), the second sub pixel (sP2) and the third sub pixel (sP3).

The first sub pixel (sP1) and the second sub pixel (sP2) are provided in a first direction, for example, a horizontal direction (direction of left and right) within one pixel (P) while being opposite to each other. Accordingly, the first sub pixel (sP1) is disposed at one side of the first direction within one pixel (P), for example, a left side of one pixel (P), and the second sub pixel (sP2) is disposed at the other side of the first direction within one pixel (P), for example a right side of one pixel (P).

According to one embodiment of the present disclosure, the two sub pixels, that is, the first sub pixel (sP1) and the second sub pixel (sP2) are provided in the first direction within one pixel (P). Accordingly, in comparison to the related art organic light emitting display device wherein three sub pixels are provided in the first direction within one pixel (P), the organic light emitting display device according to the present disclosure enables to increase a length (D1) of the first direction of the first emission layer 510 in the first sub pixel (sP1) and also to increase a length (D2) of the first direction of the second emission layer 520 in the second sub pixel (sP2) so that it is possible to individually coat a solution for the first emission layer 510 and a solution for the second emission layer 520 onto the first sub pixel (sP1) and the second sub pixel (sP2), respectively, by the use of inkjet apparatus without mixing the solutions.

Also, the third sub pixel (sP3) extends in the first direction within one pixel (P), for example, the horizontal direction (direction of left and right) within one pixel (P). That is, the third sub pixel (sP3) is provided at both opposite sides of the first direction within one pixel (P). Thus, a length (D3) of the first direction of the third emission layer 530 in the third sub pixel (sP3) is increased so that it is possible to easily coat a solution for the third emission layer 530 onto the third sub pixel (sP3) by the use of inkjet apparatus.

Also, the first sub pixel (sP1) and the third sub pixel (sP3) are opposite to each other along a second direction, which is perpendicular to the first direction, within one pixel (P), for example, a vertical direction (direction of up and down) within one pixel (P). Also, the second sub pixel (sP2) and the third sub pixel (sP3) are opposite to each other along the second direction within one pixel (P).

That is, the first sub pixel (sP1) and the second sub pixel (sP2) are disposed at one side of the second direction within one pixel (P), for example, an upper or lower side of one pixel (P), and the third sub pixel (sP3) is disposed at the other side of the second direction within one pixel (P), for example, the lower or upper side of one pixel (P).

Accordingly, in comparison to a case with three sub pixels along the second direction within one pixel (P), it is possible to increase a length (W1) of the second direction of the first emission layer 510 in the first sub pixel (sP1), a length (W2) of the second direction of the second emission layer 520 in the second sub pixel (sP2), and a length (W3) of the second direction of the third emission layer 530 in the third sub pixel (sP3). Thus, it is possible to individually coat respective solutions for the first, second and third emission layers 510, 520 and 530 onto the first, second and third sub pixels (sP1, sP2 and sP3), respectively, by the use of inkjet apparatus without mixing the solutions.

In order to appropriately adjust each area of the first emission layer 510, the second emission layer 520 and the third emission layer 530 within one pixel (P), in one embodiment, the length (W1) of the second direction of the first emission layer 510 is larger than the length (D1) of the first direction of the first emission layer 510, the length (W2) of the second direction of the second emission layer 520 is larger than the length (D2) of the first direction of the second emission layer 520, and the length (W3) of the second direction of the third emission layer 530 is smaller than the length (D3) of the first direction of the third emission layer 530.

According to one embodiment of the present disclosure, the plurality of pixels (P) arranged in the first direction are identical in structure. However, the plurality of pixels (P) arranged in the second direction are not identical in structure. In other words, the plurality of pixels (P) arranged in any one row have the same structure, however, the structure of the pixel (P) arranged in any adjacent row is different from the structure of the pixel (P) arranged in the adjoining row.

For example, in case of the pixel (P) arranged in the odd-numbered row, the first emission layer 510 and the second emission layer 520 are positioned above the third emission layer 530. Meanwhile, in case of the pixel (P) arranged in the even-numbered row, the first emission layer 510 and the second emission layer 520 are positioned below the third emission layer 530.

Accordingly, the third emission layers 530 are positioned adjacent to the boundaries between the pixel (P) arranged in the first row and the pixel (P) arranged in the second row. That is, the third emission layer 530 of the pixel (P) arranged in the first row and the third emission layer 530 of the pixel (P) arranged in the second row are opposite to each other with respect to the boundaries between the pixels (P). In this case, the third emission layer 530 of the pixel (P) arranged in the first row and the third emission layer 530 of the pixel (P) arranged in the second row emit the same colored light, for example, blue light (B). Thus, it is possible to form the third emission layer 530 of the pixel (P) arranged in the first row and the third emission layer 530 of the pixel (P) arranged in the second row, at the same time, by the use of the same solution, that is, by the use of one solution. That is, it is all right to mix the solution for the third emission layer 530 of the pixel (P) arranged in the first row and the solution for the third emission layer 530 of the pixel (P) arranged in the second row together. Actually, it is advantageous in that the two of third emission layers 530 provided in the two pixels (P) are formed at the same time by the use of one solution.

Also, the first emission layer 510 of the pixel (P) arranged in the second row and the first emission layer 510 of the pixel (P) arranged in the third row are opposite (e.g., adjacent) to each other with respect to the boundaries between the pixels (P). In this case, the first emission layer 510 of the pixel (P) arranged in the second row and the first emission layer 510 of the pixel (P) arranged in the third row emit the same colored light, for example, red light (R). Thus, it is possible to form the first emission layer 510 of the pixel (P) arranged in the second row and the first emission layer 510 of the pixel (P) arranged in the third row, at the same time, by the use of the same solution, that is, by the use of one solution. That is, it is all right to mix the solution for the first emission layer 510 of the pixel (P) arranged in the second row and the solution for the first emission layer 510 of the pixel (P) arranged in the third row together. Actually, it is advantageous in that the two of first emission layers 510 provided in the two pixels (P) are formed at the same time by the use of one solution.

Similarly, the second emission layer 520 of the pixel (P) arranged in the second row and the second emission layer 520 of the pixel (P) arranged in the third row are opposite to each other with respect to the boundaries between the pixels (P). In this case, the second emission layer 520 of the pixel (P) arranged in the second row and the second emission layer 520 of the pixel (P) arranged in the third row emit the same colored light, for example, green light (G). Thus, it is possible to form the second emission layer 520 of the pixel (P) arranged in the second row and the second emission layer 520 of the pixel (P) arranged in the third row, at the same time, by the use of the same solution, that is, by the use of one solution. That is, it is all right to mix the solution for the second emission layer 520 of the pixel (P) arranged in the second row and the second emission layer 520 of the pixel (P) arranged in the third row together. Actually, it is advantageous in that the two of second emission layers 520 provided in the two pixels (P) are formed at the same time by the use of one solution.

Also, the second emission layer 520 and the first emission layer 510 are opposite to each other with respect to the boundaries between the pixel (P) of the first column and the pixel (P) of the second column so that it is impossible to form the first emission layers 510 and the second emission layers 520, at the same time, by the use of one solution. However, the third emission layers 530 are opposite to each other with respect to the boundaries between the pixel (P) of the first column and the pixel (P) of the second column so that it is all right to mix the solution for the third emission layer 530 in the pixel (P) of the first column with the solution for the third emission layer 530 in the pixel (P) of the second column by the use of one solution when forming the third emission layer 530 for any one of the pixel (P) of the first column and the pixel (P) of the second column.

According to one embodiment of the present disclosure, there are a first pixel group including the plurality of pixels (P) arranged in the first direction, and more particularly, arranged in the first row, a second pixel group including the plurality of pixels (P) arranged in the first direction, and more particularly, arranged in the second row, and a third pixel group including the plurality of pixels (P) arranged in the first direction, and more particularly, arranged in the third row.

At this time, a structure of each of the plurality of pixels (P) included in the first pixel group is the same as a structure of each of the plurality of pixels (P) included in the third pixel group, and is different from a structure of each of the plurality of pixels (P) included in the second pixel group. The plurality of pixels (P) included in each of the first, second and third pixel groups have the same structure within each pixel group.

Also, a structure in each of the plurality of pixels (P) included in the second pixel group and a structure in each of the plurality of pixels (P) included in the first pixel group are in mirror-image relationship to each other with respect to the boundaries between the pixel (P) of the second pixel group and the pixel (P) of the first pixel group, and the structure in each of the plurality of pixels (P) included in the second pixel group and a structure in each of the plurality of pixels (P) included in the third pixel group are in mirror-image relationship to each other with respect to the boundaries between the pixel (P) of the second pixel group and the pixel (P) of the third pixel group.

In each pixel (P) of the first pixel group, the first sub pixel (sP1) and the second sub pixel (sP2) are positioned at an upper portion of each pixel (P), and the third sub pixel (sP3) is positioned at a lower portion of each pixel (P). Meanwhile, in each pixel (P) of the second pixel group, the first sub pixel (sP1) and the second sub pixel (sP2) are positioned at a lower portion of each pixel (P), and the third sub pixel (sP3) is positioned at an upper portion of each pixel (P). Also, an arrangement order of the first sub pixel (sP1) and the second sub pixel (sP2) included in the first pixel group is identical to an arrangement order of the first sub pixel (sP1) and the second sub pixel (sP2) included in the second pixel group. Accordingly, the third sub pixel (sP3) of the first pixel group is opposite to the third pixel sub pixel (sP3) of the second pixel group, and the first pixel group and the second pixel group are in mirror-image relationship to each other with respect to the boundaries between the first pixel group and the second pixel group.

In each pixel (P) of the third pixel group, the first sub pixel (sP1) and the second sub pixel (sP2) are positioned at an upper portion of each pixel (P), and the third sub pixel (sP3) is positioned at a lower portion of each pixel (P). Meanwhile, in each pixel (P) of the second pixel group, the first sub pixel (sP1) and the second sub pixel (sP2) are positioned at a lower portion of each pixel (P), and the third sub pixel (sP3) is positioned at an upper portion of each pixel (P). Also, an arrangement order of the first sub pixel (sP1) and the second sub pixel (sP2) included in the third pixel group is identical to an arrangement order of the first sub pixel (sP1) and the second sub pixel (sP2) included in the second pixel group. Accordingly, the first and second sub pixels (sP1, sP2) of the third pixel group are opposite to the first and second sub pixels (sP1, sP2) of the second pixel group, and the third pixel group and the second pixel group are in mirror-image relationship to each other with respect to the boundaries between the third pixel group and the second pixel group.

Figure 3:
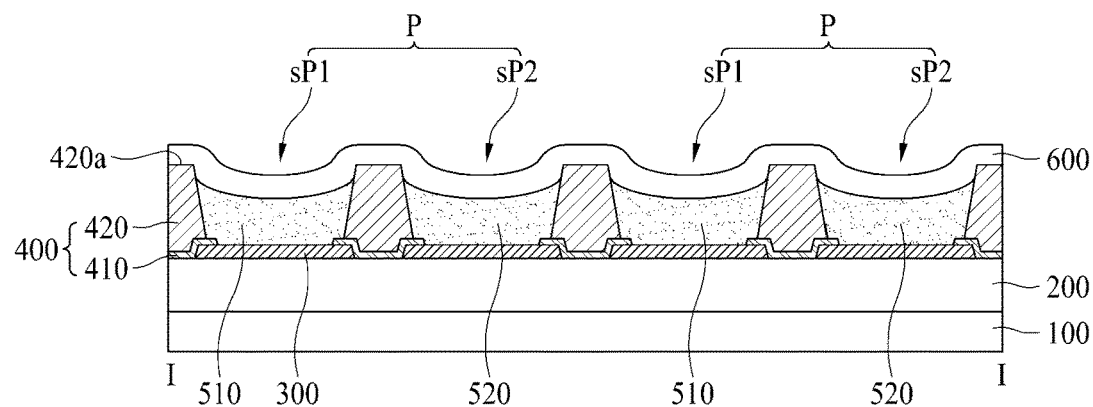
FIG. 3 is a cross sectional view illustrating the organic light emitting display device according to one embodiment of the present disclosure, which corresponds to a cross section along I-I line of FIG. 2.

FIG. 3 is a cross sectional view illustrating the organic light emitting display device according to one embodiment of the present disclosure, which corresponds to a cross sectional view along I-I line of FIG. 2.

As shown in FIG. 3, the organic light emitting display device according to one embodiment of the present disclosure may include a substrate 100, a circuit device layer 200, a first electrode 300, a bank layer 400, emission layers 510 and 520, and a second electrode 600.

The substrate 100 may be formed of glass or transparent plastic, but not limited to these materials. The substrate 100 may be formed of an opaque material.

The circuit device layer 200 is provided on the substrate 100. The circuit device layer 200 may include a thin film transistor and a capacitor provided for each sub pixel (sP1, sP2). The thin film transistor may include a switching thin film transistor, a driving thin film transistor, and a sensing thin film transistor. A structure of the circuit device layer 200 may be formed in various types generally known to those in the art.

The first electrode 300 is provided on the circuit device layer 200. The first electrode 300 may function as an anode of the organic light emitting display device. If the organic light emitting display device according to the present disclosure is a top emission type, the first electrode 300 serves as a reflection electrode. Meanwhile, if the organic light emitting display device according to the present disclosure is a bottom emission type, the first electrode 300 serves as a transparent electrode.

The bank layer 400 covers an end of the first electrode 300, and the bank layer 400 is provided on the circuit device layer 200.

The bank layer 400 is provided between the boundaries between the adjoining pixels (P). Also, the bank layer 400 is provided along the boundaries between the first sub pixel (sP1) with the first emission layer 510 and the second sub pixel (sP2) with the second emission layer 520. The bank layer 400 is provided between each of the sub pixels (sP1, sP2) so that it is possible to form an entire matrix configuration and to prepare an emission area in each of the sub pixels (sP1, sP2).

The bank layer 400 may include a first bank layer 410 and a second bank layer 420.

The first bank layer 410 is in contact with the first electrode 300 and the circuit device layer 200. A thickness of the first bank layer 410 is less than a thickness of the second bank layer 420, and a width of the first bank layer 410 is greater than a width of the second bank layer 420. Accordingly, an end of the first bank layer 410 is in contact with the emission layers 510 and 520. The first bank layer 410 with this structure has the same properties as those of the emission layers 510, that is, the hydrophilic properties. The first bank layer 410 having the hydrophilic properties may be formed of an inorganic insulating material such as silicon oxide. Accordingly, when coating the solution for the emission layer 510 and 520, the solution easily spreads on the first bank layer 410 so that the emission layer 510 and 520 spreads widely in each sub pixel (sP1, sP2).

The second bank layer 420 is patterned on the first bank layer 410. The width of the second bank layer 420 is less than the width of the first bank layer 410. The second bank layer 420 may be patterned for a sequential process of coating a mixture solution obtained by mixing the organic insulating material having the hydrophilic properties with a hydrophobic material such as fluorine, and carrying out a photolithography process. By light irradiated for the photolithography process, the hydrophobic material such as fluorine is transferred to an upper portion 420a of the second bank layer 420, whereby the upper portion 420a of the second bank layer 420 has the hydrophobic properties, and the other portions of the second bank layer 420 except the upper portion 420a have the hydrophilic properties. That is, the portion of the second bank layer 420 being in contact with the first bank layer 410 has the hydrophilic properties, and the upper portion 420a of the second bank layer 420 has the hydrophobic properties, but not limited to these structures. For example, the entire portions of the second bank layer 420 may have the hydrophobic properties.

The spreadability of the solution for the emission layers 510 and 520 may be improved by the first bank layer 410 and the predetermined portions of the second bank layer 420 which have the hydrophilic properties. Especially, according as the first bank layer 410 whose thickness is less than that of the second bank layer 420 is provided widely, it is possible to prepare a two-step structure having the hydrophilic properties by a combination of the first bank layer 410 and the second bank layer 420. Thus, the solution for the emission layers 510 and 520 easily spreads to an end area of each sub pixel (sP1, sP2) so that it is possible to prevent the emission layers 510 and 520 from being upwardly rolled at the end area of each sub pixel (sP1, sP2) with a large thickness.

Also, the upper portion 420a of the second bank layer 420, which has the hydrophobic properties, prevents the solution for the emission layers 510 and 520 from spreading to the adjoining sub pixels (sP1, sP2) so that it is possible to prevent the first emission layer 510 from permeating into the second sub pixel (sP2) and being mixed with the second emission layer 520, and also to prevent the second emission layer 520 from permeating into the first sub pixel (sP1) and being mixed with the first emission layer 510.

The emission layers 510 and 520 are provided on the first electrode 300. The emission layers 510 and 520 include the first emission layer 510 provided in the first sub pixel (sP1), and the second emission layer 520 provided in the second sub pixel (sP2).

The first emission layer 510 emits red light (R), and the second emission layer 520 emits green light (G), but not limited to these structures.

Each of the first emission layer 510 and the second emission layer 520 may be formed of a solution process using the inkjet apparatus.

Each of the first emission layer 510 and the second emission layer 520 formed by the solution process may include at least one organic layer among a hole injecting layer, a hole transporting layer, an emitting layer, an electron transporting layer, and an electron injecting layer.

For example, each of the first emission layer 510 and the second emission layer 520 may be formed in a sequential deposition structure of the hole injecting layer, the hole transporting layer, the emitting layer, the electron transporting layer, and the electron injecting layer.

If needed, each of the first emission layer 510 and the second emission layer 520 may be formed in a sequential deposition structure of the hole injecting layer, the hole transporting layer, and the emitting layer. In this case, the electron transporting layer and the electron injecting layer may be additionally deposited on each of the first emission layer 510 and the second emission layer 520 by a deposition process such as evaporation. Although not shown, the electron transporting layer and the electron injecting layer, which are provided by the deposition process, are not individually patterned by each of the first sub pixel (sP1) and the second sub pixel (sP2), and the electron transporting layer and the electron injecting layer are provided not only on the first emission layer 510 and the second emission layer 520 but also on the bank layer 400.

The second electrode 600 is provided on the emission layers 510 and 520 and the bank layer 400. The second electrode 600 serves as a cathode of the organic light emitting display device. If the organic light emitting display device according to the present disclosure is a top emission type, the second electrode 600 serves as a transparent electrode. Meanwhile, if the organic light emitting display device according to the present disclosure is a bottom emission type, the second electrode 600 serves as a reflection electrode.

Figure 4:
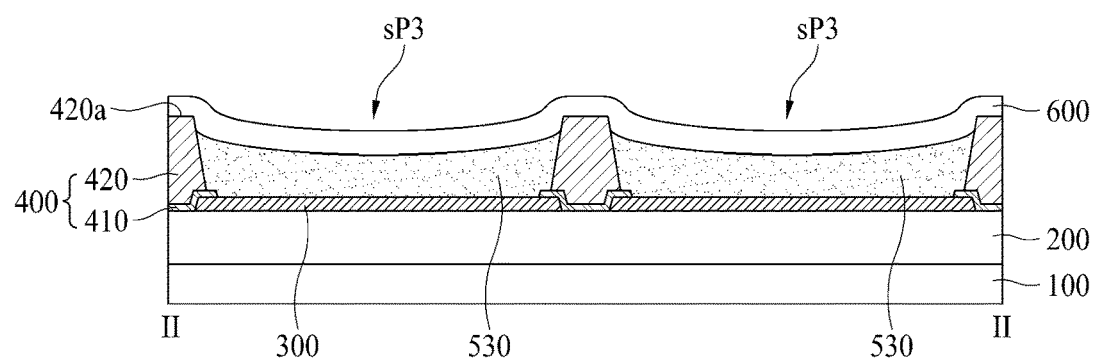
FIG. 4 is a cross sectional view illustrating the organic light emitting display device according to one embodiment of the present disclosure, which corresponds to a cross section along II-II line of FIG. 2.

FIG. 4 is a cross sectional view illustrating the organic light emitting display device according to one embodiment of the present disclosure, which corresponds to a cross sectional view along II-II line of FIG. 2.

Except that the third emission layer 530 is provided in the third sub pixel (sP3), a laminated structure of FIG. 4 is the same as the laminated structure of FIG. 3, whereby a detailed description for the same parts will be omitted.

Figure 5:
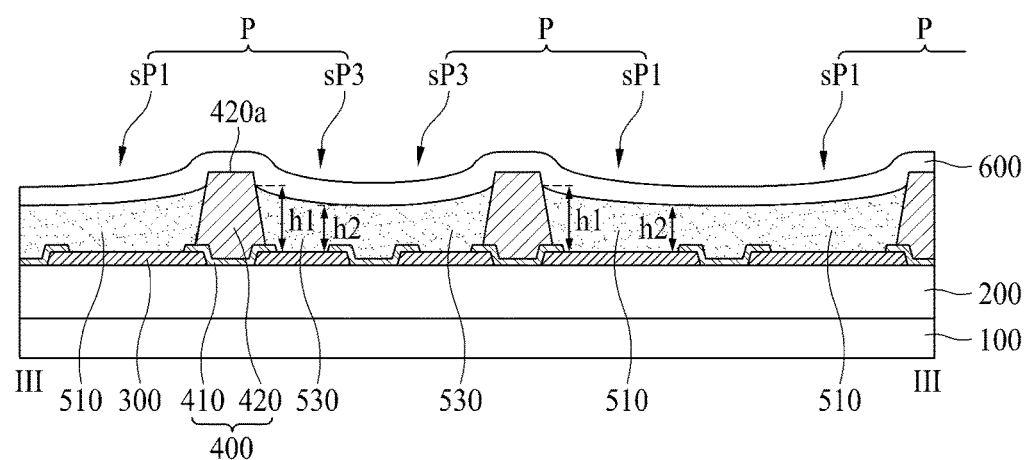
FIG. 5 is a cross sectional view illustrating the organic light emitting display device according to one embodiment of the present disclosure, which corresponds to a cross section along III-III line of FIG. 2.

FIG. 5 is a cross sectional view illustrating the organic light emitting display device according to one embodiment of the present disclosure, which corresponds to a cross sectional view along line of FIG. 2.

Except a bank layer 400 and emission layers 510 and 530, other elements are the same as those of the aforementioned description.

In the same manner as the aforementioned description, the bank layer 400 may include a first bank layer 410 and a second bank layer 420.

The first bank layer 410 is provided along the boundaries between the adjoining pixels (P). In more detail, the first bank layer 410 is provided along the boundaries between the third sub pixel (sP3) of any one pixel (P) and the third sub pixel (sP3) of the adjoining pixel (P). Also, the first bank layer 410 is provided along the boundaries between the first sub pixel (sP1) of one pixel (P) and the first sub pixel (sP1) of the adjoining pixel (P).

Also, the first bank layer 410 is provided along the boundaries between the first sub pixel (sP1) and the third sub pixel (sP3) adjacent to each other within one pixel (P).

The second bank layer 420 is provided along the boundaries between the first sub pixel (sP1) and the third sub pixel (sP3) adjacent to each other within one pixel (P). However, the second bank layer 420 is not provided along the boundaries between the third sub pixel (sP3) of one pixel (P) and the third sub pixel (sP3) of the adjoining pixel (P). Also, the second bank layer 420 is not provided along the boundaries between the first sub pixel (sP1) of one pixel (P) and the first sub pixel (sP1) of the adjoining pixel (P).

That is, if the adjacent sub pixels (sP1, sP3) correspond to the sub pixels which emit the same-colored light, for example, if the adjacent two sub pixels including the sub pixel of one pixel (P) and the sub pixel of the adjoining pixel (P) correspond to the first sub pixels (sP1) or the third sub pixels (sP3), the second bank layer 420 is not provided along the boundaries between the sub pixels, whereby the entire upper surface of the first bank layer 410 is in contact with the third emission layer 530.

On the contrary, if the adjacent sub pixels (sP1, sP3) correspond to the sub pixels which emit the different-colored light, for example, the adjacent sub pixels correspond to the first sub pixel (sP1) and the third sub pixel (sP3), the second bank layer 420 is provided along the boundaries between the adjacent sub pixels.

The first emission layer 510 provided in the first sub pixel (sP1) and the third emission layer 530 provided in the third sub pixel (sP3) within one pixel (P) are divided by the second bank layer 420. That is, the first emission layer 510 provided in the first sub pixel (sP1) and the third emission layer 530 provided in the third sub pixel (sP3) are separated from each other by the second bank layer 420 provided in-between.

On the contrary, the third emission layer 530 provided in the third sub pixel (sP3) of one pixel (P) and the third emission layer 530 provided in the third sub pixel (sP3) of the adjoining pixel (P) are not divided by the second bank layer 420, but connected with each other. That is, the second bank layer 420 is not provided between the third emission layer 530 provided in the third sub pixel (sP3) of one pixel (P) and the third emission layer 530 provided in the third sub pixel (sP3) of the adjoining pixel (P), whereby the third emission layer 530 provided in the third sub pixel (sP3) of one pixel (P) and the third emission layer 530 provided in the third sub pixel (sP3) of the adjoining pixel (P) are not divided, but connected with each other. Furthermore, the third emission layer 530 provided in the third sub pixel (sP3) of one pixel (P) and the third emission layer 530 provided in the third sub pixel (sP3) of the adjoining pixel (P) may easily spread and be mixed with each other by the first bank layer 410 provided in-between. Accordingly, the two of third emission layers 530 being opposite to each other and provided in the adjoining pixels (P) may be formed at the same time by the use of one solution.

Eventually, one end of the third emission layer 530 provided in the third sub pixel (sP3) of one pixel (P) is in contact with the second bank layer 420, and the other end of the third emission layer 530 provided in the third sub pixel (sP3) of one pixel (P) is in contact with the third emission layer 530 provided in the third sub pixel (sP3) of the adjoining pixel (P). In this reason, a thickness (h1) of one end of the third emission layer 530 is larger than a thickness (h2) of the other end of the third emission layer 530. That is, if the third emission layer 530 is formed by a solution coating and drying process, the thickness (h1) of one end of the third emission layer 530 being in contact with the second bank layer 420, wherein one end of the third emission layer 530 functions as a spreading-blocking barrier, is larger than the thickness (h2) of the other end of the third emission layer 530.

Similarly, the first emission layer 510 provided in the first sub pixel (sP1) of one pixel (P) and the first emission layer 510 provided in the first sub pixel (sP1) of the adjoining pixel (P) are not divided by the second bank layer 420, but connected with each other. Furthermore, the first emission layer 510 provided in the first sub pixel (sP1) of one pixel (P) and the first emission layer 510 provided in the first sub pixel (sP1) of the adjoining pixel (P) may easily spread and be mixed with each other by the first bank layer 410 provided in-between. Accordingly, the two of first emission layers 510 being opposite to each other and provided in the adjoining pixels (P) may be formed at the same time by the use of one solution.

Eventually, one end of the first emission layer 510 provided in the first sub pixel (sP1) of one pixel (P) is in contact with the second bank layer 420, and the other end of the first emission layer 510 provided in the first sub pixel (sP1) of one pixel (P) is in contact with the first emission layer 510 provided in the first sub pixel (sP1) of the adjoining pixel (P). In this reason, a thickness (h1) of one end of the first emission layer 510 is larger than a thickness (h2) of the other end of the first emission layer 510.

Figure 6:
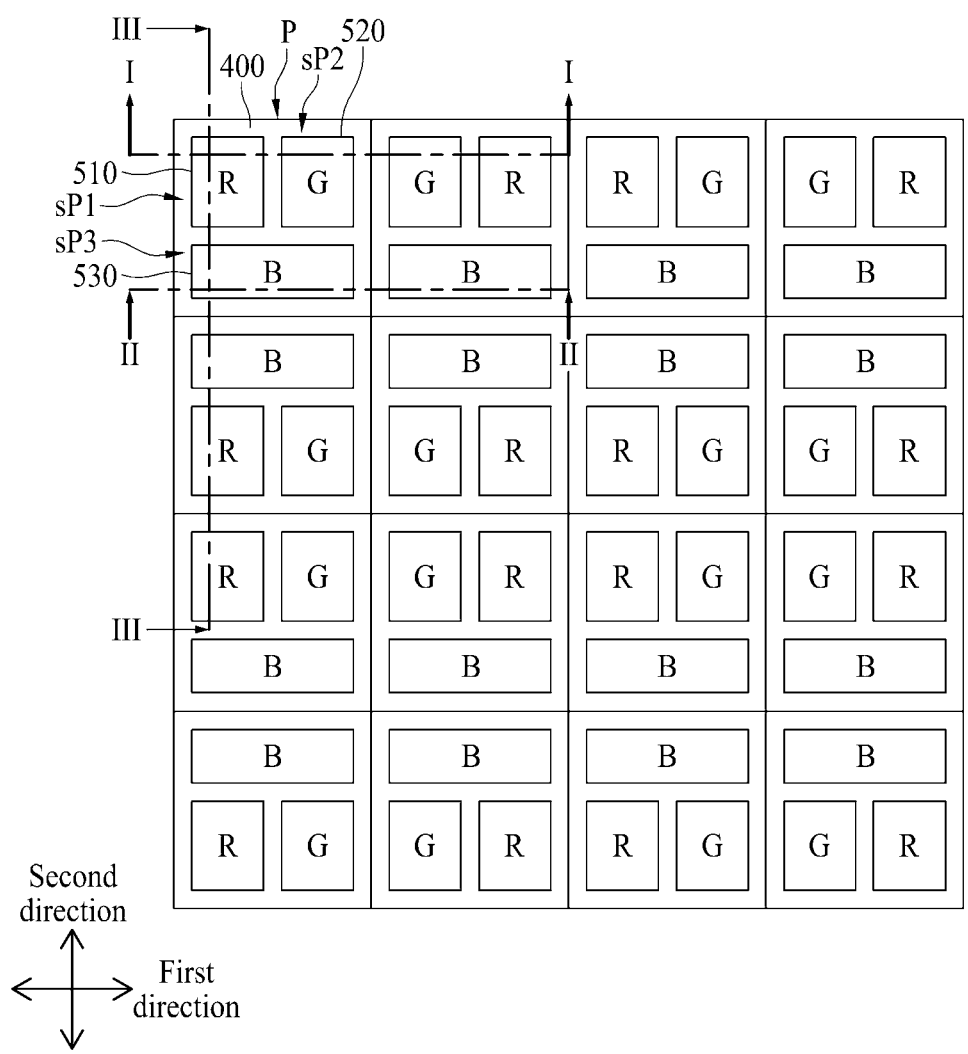
FIG. 6 is a plane view illustrating an organic light emitting display device according to another embodiment of the present invention.

FIG. 6 is a plane view illustrating an organic light emitting display device according to another embodiment of the present disclosure. Except that a plurality of pixels (P) arranged in the first direction are not identical in structure, the organic light emitting display device of FIG. 6 is the same as the organic light emitting display device of FIG. 2, whereby only different parts will be described in detail. In addition to the first pixel, second pixel and third pixel, the organic light emitting display device in FIG. 6 includes a fourth pixel adjoining to the first pixel in the first direction, wherein the second sub pixel provided in the first pixel is opposite to the second sub pixel provided in the fourth pixel.

In the above structure of FIG. 2, the plurality of pixels (P) arranged in the first direction has the same structure, whereby the first and second emission layers 510 and 520 which emit the different-colored light are opposite to each other with respect to the boundaries between each of the plurality of pixels (P) which adjoin in the first direction. Thus, as shown in FIGS. 3 and 4, the second bank layer 420 for separating the first emission layer 510 and the second emission layer 520 from each other is provided along the boundaries between each of the plurality of pixels (P) which adjoin in the first direction.

On the contrary, in case of the structure of FIG. 6, the plurality of pixels (P) arranged in the first direction are not identical in structure. In more detail, the first emission layers 510 which emit the same-colored light are opposite (e.g., adjacent) to each other or the second emission layers 520 which emit the same-colored light are opposite to each other with respect to the boundaries between each of the plurality of pixels (P) which adjoin in the first direction, for example, with respect to the boundaries between columns of the pixels (P).

In other words, in case of the pixel (P) included in one column, the first sub pixel (sP1) and the first emission layer 510 provided in the first sub pixel (sP1) are disposed at a left portion of the pixel (P), and the second sub pixel (sP2) and the second emission layer 520 provided in the second sub pixel (sP2) are disposed at a right portion of the pixel (P). Meanwhile, in case of the pixel (P) included in the adjoining column, the first sub pixel (sP1) and the first emission layer 510 provided in the first sub pixel (sP1) are disposed at a right portion of the pixel (P), and the second sub pixel (sP2) and the second emission layer 520 provided in the second sub pixel (sP2) are disposed at a left portion of the pixel (P).

Accordingly, it is possible to form the first emission layer 510 of one pixel (P) and the first emission layer 510 of the adjoining pixel (P), at the same time, by the use of one solution. In the same manner, it is possible to form the second emission layer 520 of one pixel (P) and the second emission layer 520 of the adjoining pixel (P), at the same time, by the use of one solution.

According to another embodiment of the present disclosure, there are a first pixel group including the plurality of pixels (P) arranged in the first direction, and more particularly, arranged in the first row, a second pixel group including the plurality of pixels (P) arranged in the first direction, and more particularly, arranged in the second row, and a third pixel group including the plurality of pixels (P) arranged in the first direction, and more particularly, arranged in the third row.

At this time, a structure of each of the plurality of pixels (P) included in the first pixel group is the same as a structure of each of the plurality of pixels (P) included in the third pixel group, and is different from a structure of each of the plurality of pixels (P) included in the second pixel group. The plurality of pixels (P) included in each of the first, second and third pixel groups are not identical in structure.

Also, a structure in each of the plurality of pixels (P) included in the second pixel group and a structure in each of the plurality of pixels (P) included in the first pixel group are in mirror-image relationship to each other with respect to the boundaries between the pixel (P) of the second pixel group and the pixel (P) of the first pixel group, and the structure in each of the plurality of pixels (P) included in the second pixel group and a structure in each of the plurality of pixels (P) included in the third pixel group are in mirror-image relationship to each other with respect to the boundaries between the pixel (P) of the second pixel group and the pixel (P) of the third pixel group.

In each pixel (P) of the first pixel group, the first sub pixel (sP1) and the second sub pixel (sP2) are positioned at an upper portion of each pixel (P), and the third sub pixel (sP3) is positioned at a lower portion of each pixel (P). Meanwhile, in each pixel (P) of the second pixel group, the first sub pixel (sP1) and the second sub pixel (sP2) are positioned at a lower portion of each pixel (P), and the third sub pixel (sP3) is positioned at an upper portion of each pixel (P). Also, an arrangement order of the first sub pixel (sP1) and the second sub pixel (sP2) included in the first pixel group is identical to an arrangement order of the first sub pixel (sP1) and the second sub pixel (sP2) included in the second pixel group. Accordingly, the third sub pixel (sP3) of the first pixel group is opposite to the third pixel sub pixel (sP3) of the second pixel group, and the first pixel group and the second pixel group are in mirror-image relationship to each other with respect to the boundaries between the first pixel group and the second pixel group.

In each pixel (P) of the third pixel group, the first sub pixel (sP1) and the second sub pixel (sP2) are positioned at an upper portion of each pixel (P), and the third sub pixel (sP3) is positioned at a lower portion of each pixel (P). Meanwhile, in each pixel (P) of the second pixel group, the first sub pixel (sP1) and the second sub pixel (sP2) are positioned at a lower portion of each pixel (P), and the third sub pixel (sP3) is positioned at an upper portion of each pixel (P). Also, an arrangement order of the first sub pixel (sP1) and the second sub pixel (sP2) included in the third pixel group is identical to an arrangement order of the first sub pixel (sP1) and the second sub pixel (sP2) included in the second pixel group. Accordingly, the first and second sub pixels (sP1, sP2) of the third pixel group are opposite to the first and second sub pixels (sP1, sP2) of the second pixel group, and the third pixel group and the second pixel group are in mirror-image relationship to each other with respect to the boundaries between the third pixel group and the second pixel group.

In the first pixel group and the third pixel group, the pixel with the first structure alternates with the pixel with the second structure which is different from the first structure. For example, the pixel with the first structure includes the first sub pixel (sP1) positioned at the left upper portion of the pixel, the second sub pixel (sP2) positioned at the right upper portion of the pixel, and the third sub pixel (sP3) positioned at the lower portion of the pixel, and the pixel with the second structure includes the second sub pixel (sP2) positioned at the left upper portion of the pixel, the first sub pixel (sP1) positioned at the right upper portion of the pixel, and the third sub pixel (sP3) positioned at the lower portion of the pixel. In this case, the pixel with the first structure and the pixel with the second structure are in mirror-image relationship to each other.

In the second pixel group, the pixel with the third structure alternates with the pixel with the fourth structure which is different from the third structure. For example, the pixel with the third structure includes the first sub pixel (sP1) positioned at the left lower portion of the pixel, the second sub pixel (sP2) positioned at the right lower portion of the pixel, and the third sub pixel (sP3) positioned at the upper portion of the pixel, and the pixel with the fourth structure includes the second sub pixel (sP2) positioned at the left lower portion of the pixel, the first sub pixel (sP1) positioned at the right lower portion of the pixel, and the third sub pixel (sP3) positioned at the upper portion of the pixel. In this case, the pixel with the third structure and the pixel with the fourth structure are in mirror-image relationship to each other.

Figure 7:
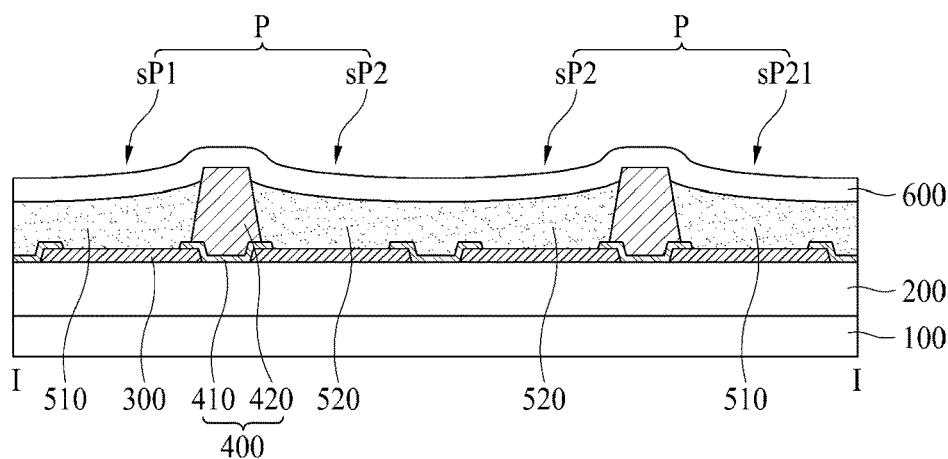
FIG. 7 is a cross sectional view illustrating the organic light emitting display device according to another embodiment of the present disclosure, which corresponds to a cross section along I-I line of FIG. 6.

FIG. 7 is a cross sectional view illustrating the organic light emitting display device according to another embodiment of the present disclosure, which corresponds to a cross sectional view along I-I line of FIG. 6. Hereinafter, only different parts, which are different from those of FIG. 3, will be described in detail as follows.

In the above structure of FIG. 3, the second emission layer 520 of one pixel (P) is opposite to the first emission layer 510 of the adjoining pixel (P), whereby the second bank layer 420 is provided along the boundaries between the adjoining pixels (P) so as to prevent the second emission layer 520 and the first emission layer 510 from being connected with each other.

On the contrary, in the structure of FIG. 7, the second emission layer 520 of the first pixel (P) is opposite to the second emission layer 520 of the fourth pixel (P), whereby the second emission layers 520 being opposite to each other are connected with each other. Thus, only the first bank layer 410 is provided along the boundaries between the adjoining pixels (P), however, the second bank layer 420 is not provided along the boundaries between the adjoining pixels (P).

Accordingly, the second emission layer 520 of the first pixel (P) and the second emission layer 520 of the fourth pixel (P) may easily spread and be mixed with each other by the first bank layer 410. Accordingly, the two of second emission layers 520 being opposite to each other and provided in the adjoining pixels (P) may be formed at the same time by the use of one solution.

Although not shown, in the same manner as the second emission layers 520 being opposite to each other, the first emission layer 510 of the first pixel (P) and the first emission layer 510 of the fourth pixel (P) may easily spread and be mixed with each other by the first bank layer 410. Accordingly, the two of first emission layers 510 being opposite to each other and provided in the adjoining pixels (P) may be formed at the same time by the use of one solution.

Figure 8:
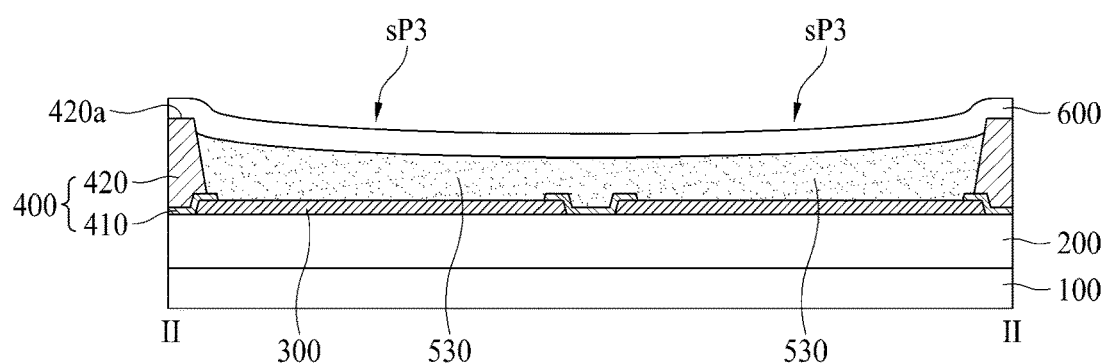
FIG. 8 is a cross sectional view illustrating the organic light emitting display device according to another embodiment of the present disclosure, which corresponds to a cross section along II-II line of FIG. 6.

FIG. 8 is a cross sectional view illustrating the organic light emitting display device according to another embodiment of the present disclosure, which corresponds to a cross sectional view along II-II line of FIG. 6.

Except the third emission layer 530 provided in the third sub pixel (sP3), the deposition structure of FIG. 8 is the same as the deposition structure of FIG. 7, whereby a detailed description for the same parts will be omitted, and hereinafter, only different parts, which are different from those of FIG. 7, will be described in detail as follows.

In the structure of FIG. 8, the third emission layer 530 of one pixel (P) is opposite to the third emission layer 530 of the adjoining pixel (P), whereby the third emission layers 530 being opposite to each other are connected with each other. Thus, only the first bank layer 410 is provided along the boundaries between the adjoining pixels (P), however, the second bank layer 420 is not provided along the boundaries between the adjoining pixels (P).

Figure 9:
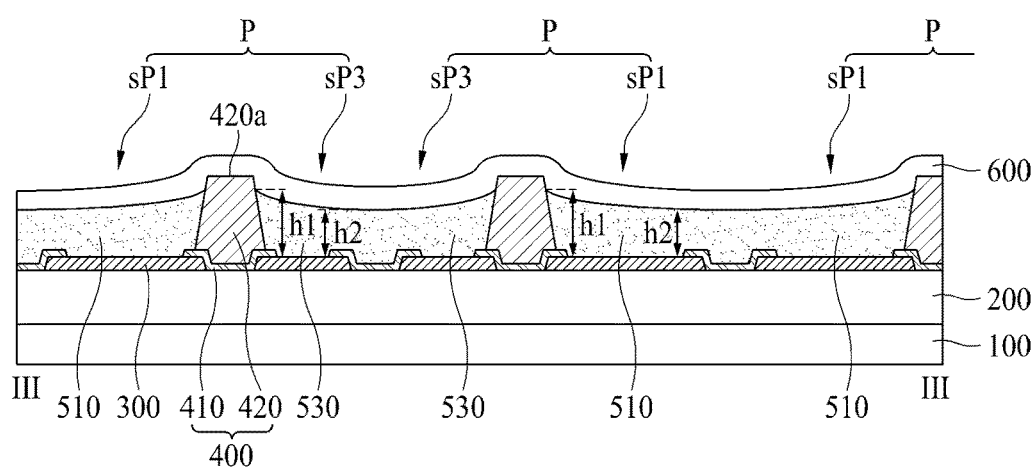
FIG. 9 is a cross sectional view illustrating the organic light emitting display device according to another embodiment of the present invention, which corresponds to a cross section along III-III line of FIG. 6.

FIG. 9 is a cross sectional view illustrating the organic light emitting display device according to another embodiment of the present disclosure, which corresponds to a cross sectional view along line of FIG. 6.

The structure of FIG. 9 is the same as the structure of FIG. 5, whereby a detailed description for the same parts will be omitted.

According to the embodiment of the present disclosure, the emission layer provided in the sub pixel of any one pixel and the emission layer provided in the sub pixel of the adjoining another pixel, which are opposite to each other, emit the same-colored light so that it is possible to form the two adjoining emission layers at the same time by the use of one solution. Thus, even though the pixel is decreased in size, it is possible to coat the emission layer by the use of inkjet apparatus, to thereby realize the high-resolution organic light emitting display device by the solution process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a plurality of pixels arranged in a first direction and a second direction that intersects the first direction, the plurality of pixels including a first pixel, a second pixel adjacent to the first pixel in the second direction, and a third pixel adjacent to second pixel in the second direction,
wherein each of the first pixel, second pixel, and third pixel includes a first sub pixel, a second sub pixel that is adjacent to the first sub pixel in the first direction, and a third sub pixel that is adjacent to the first subpixel and the second sub-pixel in the second direction,
the first sub pixel in each of the plurality of pixels including a first emission layer,
the second sub pixel in each of the plurality of pixels including a second emission layer, and
the third sub pixel in each of the plurality of pixels including a third emission layer, and
wherein the third sub pixel that is included in the first pixel is adjacent to the third sub pixel that is included in the second pixel in the second direction; and
a bank layer provided between the first emission layer and the third emission layer to separate the first emission layer and the third emission layer from each other,
wherein a thickness of the third emission layer that is common to the first pixel and the second pixel is non-uniform, and
wherein thickest portions of the third emission layer are in contact with the bank layer.

2. The organic light emitting display device according to claim 1, wherein the first emission layer and the third emission layer in each of the plurality of pixels are separated from each other, and the third emission layer provided in the first pixel and the third emission layer provided in the second pixel is a common third emission layer that extends from the first pixel to the second pixel.

3. The organic light emitting display device according to claim 2,
wherein one end of the third emission layer that is common to both the first pixel and the second pixel is in contact with the bank layer in the first pixel, and the other end of the third emission layer that is common to both the first pixel and the second pixel is in contact with the bank layer in the second pixel.

4. The organic light emitting display device according to claim 1, further comprising:
a first bank layer provided between the first sub pixel in the first pixel and the third sub pixel in the first pixel, and the first bank layer also provided between the third sub pixel in the first pixel and the third sub pixel in the second pixel; and
a second bank layer provided on the first bank layer,
wherein an entire upper surface of the first bank layer provided between the third sub pixel in the first pixel and the third sub pixel in the second pixel is in contact with the third emission layer that is common to the first pixel and the second pixel.

5. The organic light emitting display device according to claim 1, wherein the first sub pixel of the second pixel is adjacent to the first sub pixel of the third pixel in the second direction.

6. The organic light emitting display device according to claim 5, wherein the first emission layer of the first sub pixel in the second pixel and the first emission layer of the first sub pixel in the third pixel is a common first emission layer that extends from the second pixel to the third pixel.

7. The organic light emitting display device according to claim 6,
wherein a first bank layer having hydrophilic properties is between the first sub pixel in the second pixel and the first sub pixel in the third pixel, and
wherein an entire upper surface of the first bank layer is in contact with the first emission layer that is common to the second pixel and the third pixel.

8. The organic light emitting display device according to claim 1,
wherein a length of the first emission layer in the second direction is larger than a length of the first emission layer in the first direction,
a length of the second emission layer in the second direction is larger than a length of the second emission layer in the first direction, and
a length of the third emission layer in the second direction is less than a length of the third emission layer in the first direction.

9. The organic light emitting display device according to claim 1, further comprising:
a fourth pixel adjacent to the first pixel in the first direction, wherein the second sub pixel provided in the first pixel is adjacent to the second sub pixel in the fourth pixel in the first direction.

10. The organic light emitting display device according to claim 9, wherein the second emission layer in the first pixel and the second emission layer in the fourth pixel is a common second emission layer that extends from the first pixel to the fourth pixel.

11. An organic light emitting display device comprising:
a first pixel;
a second pixel adjacent to the first pixel in a first direction;
a third pixel adjacent to the first pixel in a second direction that intersects the first direction;
each of the first pixel, the second pixel, and the third pixel comprising a first sub pixel, a second sub pixel, and a third sub pixel;
a first emission layer included in the first sub pixel;
a second emission layer included in the second sub pixel;
a third emission layer included in the third sub pixel; and
a bank layer provided between the first emission layer and the third emission layer to separate the first emission layer and the third emission layer from each other,
wherein the first emission layer, the second emission layer, and the third emission layer provided in the first pixel, the second pixel, and the third pixel are separated from each other,
wherein the third emission layer included in the third sub pixel of the first pixel and the third emission layer included in the third sub-pixel of the third pixel is a common third emission layer that extends from the first pixel to the third pixel,
wherein a thickness of the third emission layer is non-uniform, and
wherein thickest portions of the third emission layer are in contact with the bank layer.

12. The organic light emitting display device according to claim 11, wherein the second emission layer included in the second sub pixel of the first pixel and the second emission layer included in the second sub pixel of the second pixel is a common second emission layer that extends from the first pixel to the second pixel.

13. The organic light emitting display device according to claim 11, further comprising a fourth pixel adjacent to the third pixel in the second direction, and the first emission layer included in the first sub pixel of the third pixel and the first emission layer included in the first sub pixel of the fourth pixel is a common first emission layer that extends from the third pixel to the fourth pixel.

14. An organic light emitting display device comprising:
a first pixel group including a plurality of pixels arranged in a first direction;
a second pixel group adjacent to the first pixel group, the second pixel group including a plurality of pixels arranged in the first direction,
wherein an arrangement of sub pixels within the plurality of pixels included in the first pixel group and an arrangement of sub pixels within the plurality of pixels included in the second pixel group is symmetrical across a boundary between the first pixel group and the second pixel group that extends along the first direction,
wherein the sub pixels within each of the plurality of pixels includes a first sub pixel with a first emission layer, a second sub pixel with a second emission layer, and a third sub pixel with a third emission layer, and
wherein the third sub pixel of each of the plurality of pixels in the first pixel group is adjacent to one third sub pixel from the plurality of pixels in the second pixel group; and
a first bank layer provided between the first sub pixel in the first pixel and the third sub pixel in the first pixel group, and the first bank layer also provided between the third sub pixel in the first pixel group and the third sub pixel in the second pixel group; and
a second bank layer provided on the first bank layer,
wherein an entire upper surface of the first bank layer provided between the third sub pixel in the first pixel group and the third sub pixel in the second pixel group is in contact with the third emission layer that is common to the first pixel and the second pixel.

15. The organic light emitting display device according to claim 14, further comprising:
a third pixel group adjacent to the second pixel group, the third pixel group including a plurality of pixels arranged in the first direction,
wherein the second pixel group is disposed between the first pixel group and the third pixel group,
wherein the arrangement of sub pixels within the plurality of pixels included in the first pixel group is substantially identical to an arrangement of sub pixels within the plurality of pixels included in the third pixel group, and
wherein the arrangement of sub pixels of the pixels included in the second pixel group and the arrangement of sub pixels of the pixels included in the third pixel group is symmetrical across a boundary between the second pixel group and the third pixel group that extends along the first direction.

16. The organic light emitting display device according to claim 15,
wherein
each of the first sub pixel and the second sub pixel of each of the plurality of pixels in the second pixel group is adjacent to one first sub pixel and second sub pixel from the plurality of pixels in the third pixel group.

17. The organic light emitting display device according to claim 15, wherein the arrangement of the sub pixels within the plurality of pixels provided in the first pixel group is the same,
wherein the arrangement of the sub pixels within the plurality of pixels provided in the second pixel group is the same, and
wherein the arrangement of the sub pixels within the plurality of pixels provided in the third pixel group is the same.

18. The organic light emitting display device according to claim 14, wherein the plurality of pixels in the first pixel group include a first pixel with sub pixels having a first arrangement, and a second pixel with sub pixels having a second arrangement that is different from the first arrangement, wherein the first arrangement and the second arrangement of sub pixels alternates in the plurality of pixels within the first pixel group,
wherein the first arrangement of sub pixels and the second arrangement of sub pixels is symmetrical across a boundary between the first pixel and the second pixel that extends in the second direction.

19. The organic light emitting display device according to 18, wherein the plurality of pixels in the second pixel group include a third pixel with sub pixels having a third arrangement that is different from the first arrangement and the second arrangement of sub pixels, and a fourth pixel with sub pixels having a fourth arrangement that is different from the third arrangement, and wherein the third arrangement and the fourth arrangement of sub pixels alternates in the plurality of pixels within the second pixel group,
wherein the third arrangement of sub pixels and the fourth arrangement of subpixels is symmetrical across a boundary between the third pixel and the fourth pixel that extends in the second direction.

20. An organic light emitting display device comprising:
a plurality of pixels arranged in a first direction and a second direction that intersects the first direction, the plurality of pixels including a first pixel and a second pixel adjacent to the first pixel in the second direction;
wherein the first pixel includes a first plurality of sub pixels, and wherein the second pixel includes a second plurality of sub pixels,
wherein only a single sub pixel of the first plurality of sub pixels in the first pixel is adjacent to a single sub pixel of the second plurality of pixels in the second pixel in the second direction, and
wherein the single sub pixel in the first pixel is of a same color as the single sub pixel in the second pixel;
an emission layer disposed commonly to the single sub pixel in the first pixel and the single sub pixel in the second pixel;
a first bank layer provided between two of the single sub pixel in the first pixel and in the second pixel; and
a second bank layer provided on the first bank layer,
wherein an entire upper surface of the first bank layer provided between the single sub pixel in the first pixel and the single sub pixel in the second pixel is in contact with the emission layer.

21. The organic light emitting display device of claim 20, wherein the plurality of pixels further includes a third pixel that is adjacent to the first pixel in the first direction, the third pixel comprising a third plurality of sub pixels, and
wherein only two sub pixels of the first plurality of sub pixels in the first pixel is adjacent to two sub pixels of the third plurality of sub pixels in the third pixel in the first direction.

* * * * *